United States Patent [19]

Matsuki

[11] Patent Number: 5,120,988
[45] Date of Patent: Jun. 9, 1992

[54] CLOCK GENERATOR CIRCUIT PROVIDING REDUCED CURRENT CONSUMPTION

[75] Inventor: Koji Matsuki, Yokohama, Japan

[73] Assignee: Kabushiki Kaisha Toshiba, Kanagawa, Japan

[21] Appl. No.: 751,637

[22] Filed: Aug. 26, 1991

Related U.S. Application Data

[63] Continuation of Ser. No. 565,197, Aug. 9, 1990, abandoned, which is a continuation of Ser. No. 233,097, Aug. 15, 1988, abandoned.

[30] Foreign Application Priority Data

Aug. 28, 1987 [JP] Japan .................. 62-214318

[51] Int. Cl.⁵ .................. H03K 7/00; H03K 17/00
[52] U.S. Cl. .................. 307/269; 307/480; 328/63; 328/72; 328/120; 377/78; 377/104
[58] Field of Search .................. 328/55, 63, 72, 120; 307/480, 269; 377/70-74, 77-81, 104

[56] References Cited

U.S. PATENT DOCUMENTS

| | | | |
|---|---|---|---|
| 3,720,841 | 3/1973 | Suzuki | 377/72 |
| 3,737,673 | 6/1973 | Suzuki | 377/97 X |
| 3,971,920 | 7/1976 | Johnson | 377/28 |
| 4,034,301 | 7/1977 | Kashio | 377/72 |
| 4,341,950 | 7/1982 | Kyles et al. | 377/30 |
| 4,472,821 | 9/1984 | Mazin et al. | 377/79 |
| 4,794,628 | 12/1988 | Sakamoto | 377/28 |
| 4,920,282 | 4/1990 | Muraoka et al. | 377/79 X |

Primary Examiner—Timothy P. Callahan
Attorney, Agent, or Firm—Finnegan, Henderson, Farabow, Garrett and Dunner

[57] ABSTRACT

A clock generator contained in an integrated circuit has an input terminal, a first output terminal, and a second output terminal. When the input terminal of this clock generator receives a basic clock signal supplied by an external integrated circuit, the first output terminal outputs a first clock signal in response to the basic clock signal, and the second output terminal outputs a second clock signal which is an inverted clock signal of the first clock signal in response to the basic clock signal. When the input terminal receives a constant level signal supplied by the external integrated circuit, the first output terminal and the second output terminal output respectively the same constant level signal to thus provide reduced power consumption.

8 Claims, 5 Drawing Sheets

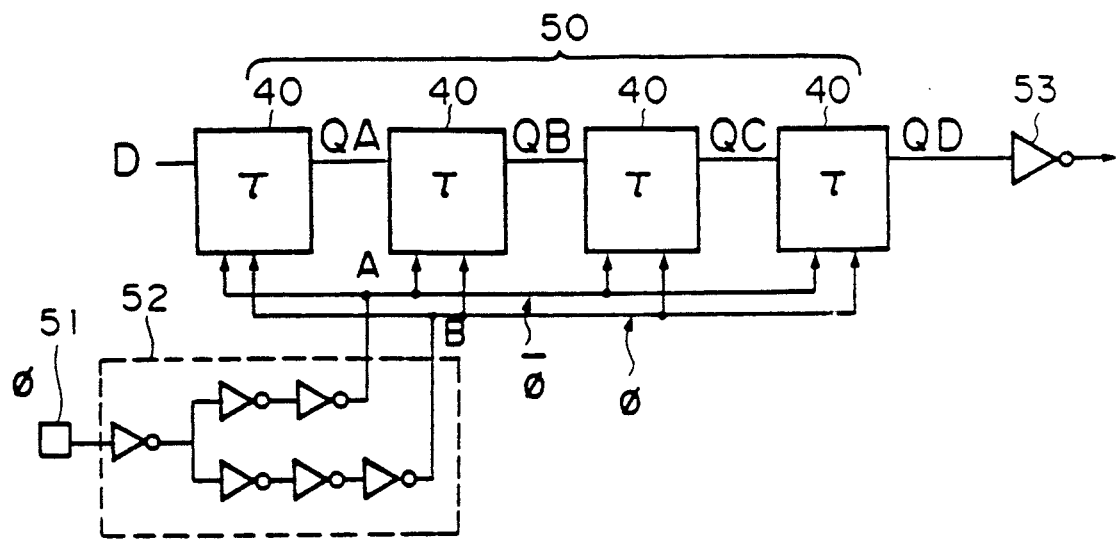
Fig. 1
(PRIOR ART)
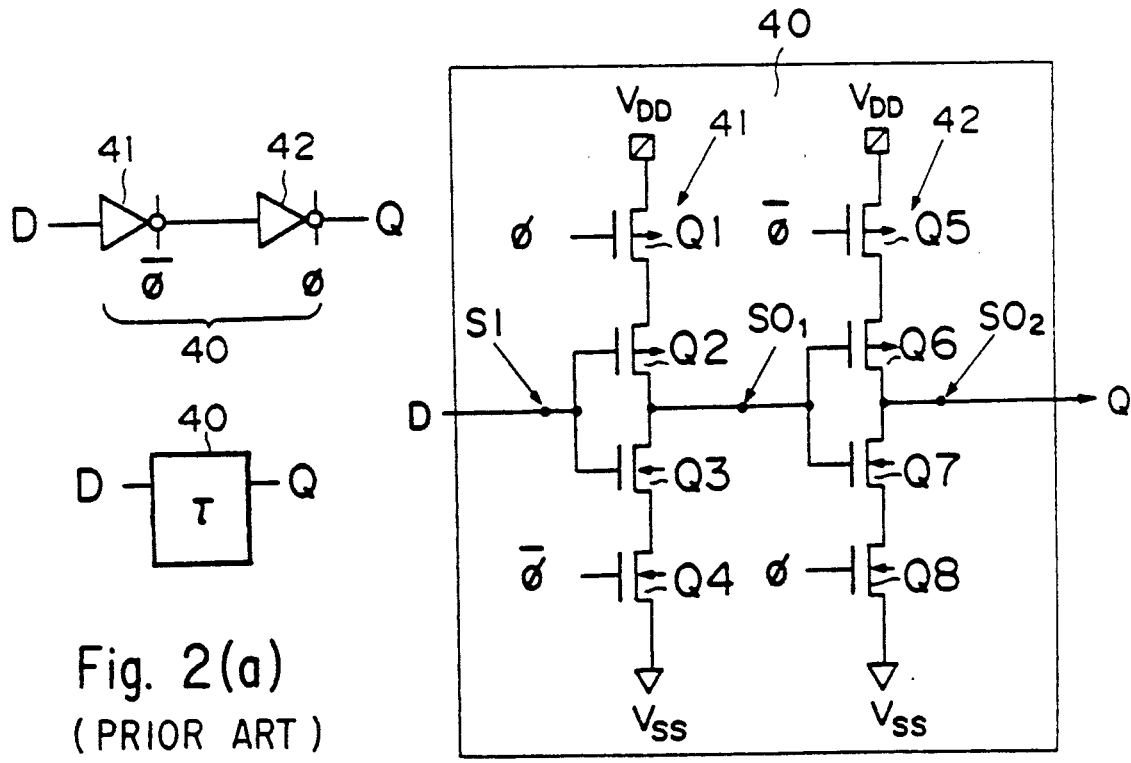
Fig. 2(a)
(PRIOR ART)
Fig. 2(b)
(PRIOR ART)

CLOCK GENERATOR CIRCUIT PROVIDING REDUCED CURRENT CONSUMPTION

This application is a continuation of application Ser. No. 07/565,197, filed Aug. 9, 1990, now abandoned, which is in turn a continuation of Ser. No. 07/233,097, filed Aug. 15, 1988, now is abandoned.

BACKGROUND OF THE INVENTION

This invention relates to clock generators and, more particularly, to clock generators for use with clock oscillator circuits.

Circuits referred to in this description are digital circuits operating at high level logic states and low level logic states. Throughout this description, the high level logic state will be referred to as "HI" and the low level logic state will be referred to as "LO."

Digital data circuits as shown in FIG. 1 are known in which a clock generator 52 and a dynamic shift register unit 50 are provided for delaying a data signal D generated by an associated integrated circuit (not shown). Delay operation is provided in response to system clock signals $\phi$ and $\bar{\phi}$ supplied by clock generator 52.

In circuits such as shown in FIG. 1, when a pulse basic clock signal $\phi$ generated by an external circuit (for example, a crystal oscillator clock circuit, not shown) is supplied to an input terminal 51 of clock generator 52, clock generator 52 provides dynamic shift register unit 50 with a first system clock signal $\phi$ and a second system clock signal $\bar{\phi}$, which is an inverted signal of the first system clock signal $\phi$.

FIGS. 2(a) and 2(b) respectively show logic diagram and an electrical schematic diagram of a shift register circuit 40, consisting of a CMOS (complementary metal oxide semiconductor) dynamic shift register circuit which delays data signal D supplied by the associated integrated circuit. The circuits shown in FIGS. 2(a) and 2(b) are the same as the shift register circuits 40 shown in FIG. 1. Shift register 40, which is controlled by the clock signals $\phi$, $\bar{\phi}$ supplied by clock generator 52, includes a first clocked complementary metal oxide semiconductor (C²MOS) inverter circuit 41 which comprises P channel MOS transistors Q1 and Q2, and N channel MOS transistors Q3 and Q4. P channel MOS transistors Q1 and Q2 are connected in series between a power source terminal at a voltage level $V_{DD}$ and a data output terminal SO₁. N channel MOS transistors Q3 and Q4 are connected in series between a power source terminal at a voltage level $V_{SS}$ and data output terminal SO₁. A gate of MOS transistor Q1 receives first system clock signal $\phi$ supplied by clock generator 52, and a gate of MOS transistor Q4 receives second system clock signal $\bar{\phi}$ from clock generator 52. A gate of the MOS transistor Q2 and a gate of the MOS transistor Q3, which are connected together to a data input terminal SI, receive data signal D.

Shift register circuit 40 also includes a second C²MOS circuit 42 which comprises P channel MOS transistors Q5 and Q6, and N channel MOS transistors Q7 and Q8. P channel transistors Q5 and Q6 are connected in series between a power source terminal at a voltage level $V_{DD}$ and a data output terminal SO₂. N channel MOS transistors Q7 and Q8 are connected in series between a power source terminal at a voltage level $V_{SS}$ and data output terminal SO₂. A gate of MOS transistor Q5 receives the second system clock signal $\bar{\phi}$ supplied by clock generator 52, and a gate of MOS transistor Q8 receives the first system clock signal $\phi$ supplied by clock generator 52. A gate of MOS transistor Q6 and a gate of MOS transistor Q7 are connected together to data output terminal SO₁. Output terminal SO₂ provides an output data signal Q. Data signal Q is the same as data signal D, but is delayed by shift register 40. Output terminal SO₂ is connected to a data input terminal SI of a succeeding shift register 40.

In circuits as shown in FIG. 1, shift register unit 50 is a 4-bit delay circuit having four shift registers 40. The basic clock signal $\phi$ provided by the external circuit (for example, the crystal oscillator clock circuit) to input terminal 51, is supplied to clock generator 52. Clock generator 52 generates system clock signals $\phi$ and $\bar{\phi}$ in response to basic clock signal $\phi$. Usually, a CMOS inverter 53 is connected to data output terminal SO₂ of the last stage of shift register unit 50.

When the associated integrated circuit is in a normal operation mode, basic clock signal $\phi$ provided to input terminal 51 is a pulse basic clock signal. When the associated integrated circuit is not in the normal operation mode, a constant level signal, that is, a constant HI or a constant LO, is supplied to input terminal 51. At this time, current flows between $V_{DD}$ and $V_{SS}$ in shift register 40 and CMOS inverter 53. When a constant HI is supplied to input terminal 51, in C²MOS circuit 41 shown in FIG. 2(b), a constant HI is supplied to the gate of MOS transistor Q1 and the gate of MOS transistor Q8, and a constant LO is supplied to the gate of MOS transistor Q4 and the gate of MOS transistor Q5 by clock generator 52. As a result, MOS transistor Q1 and MOS transistor Q4 become high impedance, so that the voltage level of data output terminal SO₁ becomes an intermediate voltage between $V_{DD}$ and $V_{SS}$. For example, terminal SO₁ may become one half of $V_{DD}$ when $V_{SS}$ equals zero volts. At this time, MOS transistor Q5 and MOS transistor Q8 of C²MOS circuit 42 are low impedance. MOS transistor Q6 and MOS transistor Q7 are also low impedance, because the gate of MOS transistor Q6 and the gate of the MOS transistor Q7 receive the intermediate voltage between $V_{DD}$ and $V_{SS}$, supplied by data output terminal SO₁. Accordingly, current flows between terminal $V_{DD}$ and terminal $V_{SS}$ of the C²MOS circuit 42.

On the other hand, when a constant LO is supplied to input terminal 51 in C²MOS circuit 41 shown in FIG. 2(b), a constant LO is supplied to the gate of MOS transistor Q1 and the gate of MOS transistor Q8, and a constant HI is supplied to the gate of MOS transistor Q4 and the gate of the MOS transistor Q5 by clock generator 52. MOS transistor Q5 and MOS transistor Q8 become high impedance. As a result, the voltage level of the data output terminal SO₂ may become an intermediate value between $V_{DD}$ and $V_{SS}$. For example, the terminal SO₂ becomes one half of $V_{DD}$, when $V_{SS}$ equals zero volts. At this time, the intermediate voltage between $V_{DD}$ and $V_{SS}$ causes current flow through the integrated circuit connected to data output terminal SO₂. For example, if CMOS inverter 53 is connected to data output terminal SO₂, current flows between $V_{DD}$ and $V_{SS}$ of inverter 53.

SUMMARY OF THE INVENTION

Accordingly, it is an object of this invention to provide a digital data circuit, for use with an associated integrated circuit, including a clock generator which can completely prevent current from flowing between the $V_{DD}$ and $V_{SS}$ terminals when the associated integrated circuit is not in a normal operation mode.

According to this invention, a digital data circuit is provided for use with a clock oscillator having an operational mode and a non-operational mode, the clock oscillator producing a basic clock signal consisting of a pulse basic clock signal operating between first and second logic levels during the operational mode and a constant level basic clock signal during the non-operational mode. The digital data circuit comprises clock signal generator means having an input terminal for receiving the basic clock signal, for outputting first and second output clock signals at respective first and second clock output terminals when the pulse basic clock signal is received, and for outputting a first control signal fixed at the first logic level when the constant level basic clock signal at the first logic level is received and when the constant level basic clock signal at the second logic level is received. The digital data circuit further comprises shift register means connected to the clock signal generator means for receiving an input data signal, for assuming a shift register mode to produce an output data signal comprising a delayed input data signal in response to the first and second output clock signals, and for assuming a low-current mode in response to the first control signal.

The accompanying drawings, which are incorporated in and constitute a part of this specification, illustrate embodiments of the invention, and, together with the description, serve to explain the principles of the present invention.

BRIEF DESCRIPTION OF THE DRAWINGS

FIG. 1 shows a conventional circuit including a clock generator which drives a dynamic shift register unit;

FIGS. 2(a) and 2(b) show a conventional shift register for delaying an input data signal D in the shift register unit of FIG. 1.

DETAILED DESCRIPTION OF THE PREFERRED EMBODIMENTS

Figure 3:
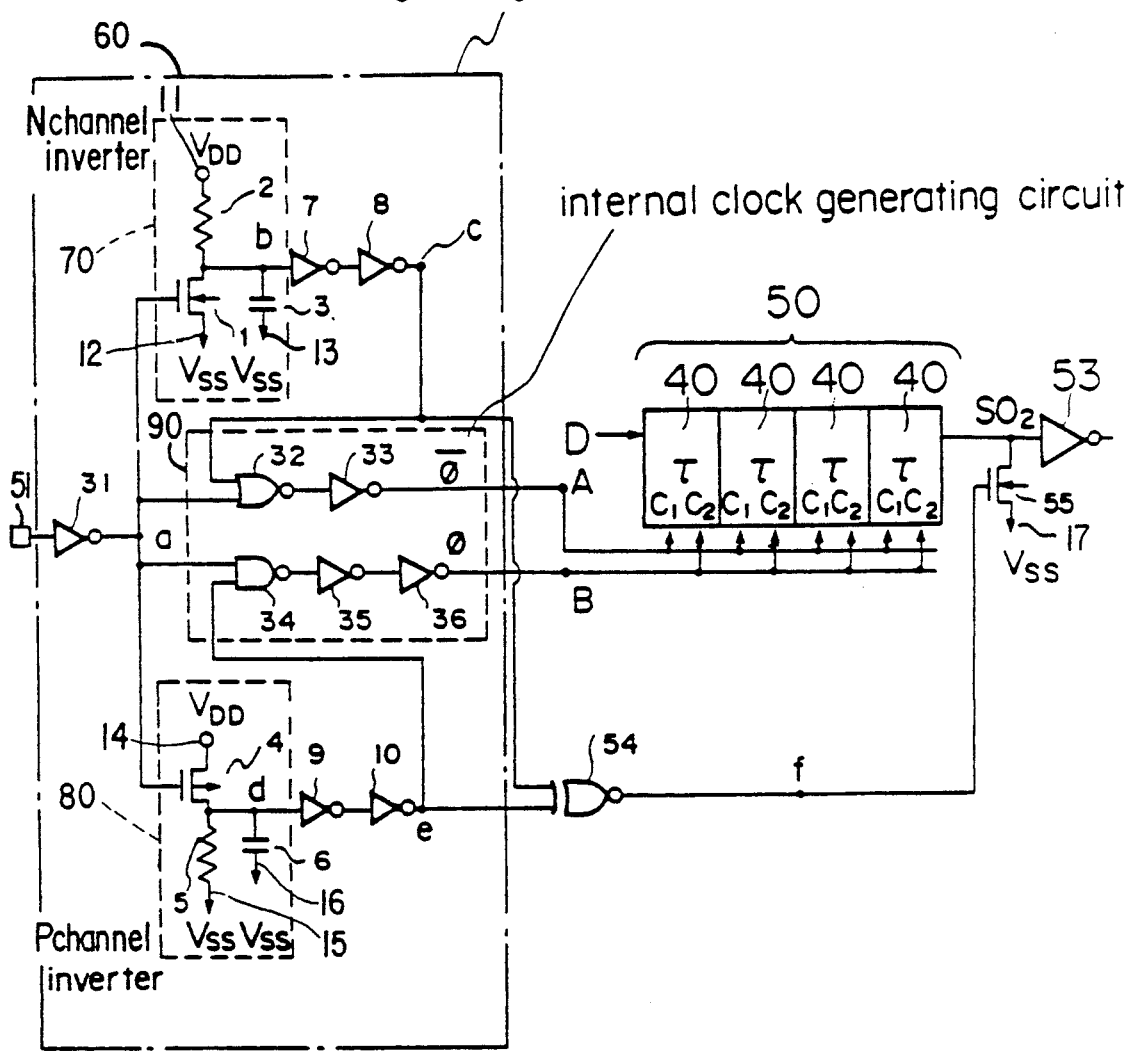
FIG. 3 shows a digital data circuit according to one embodiment of this invention.

Referring now to the drawings, in which like reference characters refer to corresponding elements, FIG. 3 shows a digital data circuit 100 which constitutes one embodiment of this invention.

The invention includes clock signal generator means having an input terminal for receiving the basic clock signal, for outputting first and second output clock signals at respective first and second clock output terminals when the pulse basic clock signal is received, and for outputting a first control signal fixed at the first logic level when the constant level basic clock signal at the first logic level is received and when the constant level basic clock signal at the second logic level is received. As embodied herein, the clock signal generator means comprises a clock signal generator circuit 60.

Preferably, the clock signal generator means comprises first detection circuit means, connected to the input terminal and having a first detection signal output terminal, for outputting a first detection signal when the pulse basic clock signal is provided to the input terminal and for outputting a second detection signal when the pulse basic clock signal is not provided to the input terminal. As embodied herein, the first detection circuit means comprises an N channel inverter circuit 70 and inverters 7 and 8.

As shown in FIG. 3, N channel inverter circuit 70 includes power source terminals 11, 12, and 13, respectively at voltage levels $V_{DD}$, $V_{SS}$, and $V_{SS}$. N channel inverter circuit 70 also includes an N channel transistor 1, a resistor 2, and a capacitor 3. Input terminal 51 for receiving basic clock signal $\phi$ is connected to a gate of N channel transistor 1 through an inverter circuit 31. A drain of N channel transistor 1 is connected to power source terminal 11 through resistor 2, and a source of N channel transistor 1 is connected to terminal 12.

N channel transistor 1 begins to conduct when its gate receives a HI (for example, $V_{DD}$), and it becomes non-conductive when its gate receives a LO (for example, $V_{SS}$).

The source of N channel transistor 1 is connected to one terminal of capacitor 3, the other terminal of which is connected to power source terminal 13. A time constant RC of capacitor 3 and resistor 2 is set longer than one cycle of the basic clock signal. For example, RC may be two times or three times as long as one cycle of the basic clock signal.

In order to activate a downstream inverter stage, the rise in voltage Vr when an N-channel MOSFET transitions to the off state must be larger than the threshold voltage of the next inverter stage, whose logical threshold voltage is approximately one half of $V_{DD}$. Therefore, an output signal from N channel inverter 70 requires a finite time period to rise from LO to HI. The rise time is longer than one pulse of the pulse basic clock signal. An output signal of N channel inverter 70 is supplied through inverters 7 and 8 to a first detection signal output terminal, designated as node c in FIG. 3. The LO and HI logic states of the output signal supplied at node c respectively constitute the first and second detection signals.

Preferably, the clock signal generator means further comprises second detection circuit means, connected to the input terminal and having a second detection signal output terminal, for outputting a third detection signal when the pulse basic clock signal is provided to the input terminal and for outputting a fourth detection signal when the pulse basic clock signal is not provided to the input terminal. As embodied herein, the second detection circuit means comprises a P channel inverter 80 and inverters 9 and 10. P channel inverter 80 includes power source terminals 14, 15, and 16, respectively at voltage levels $V_{DD}$, $V_{SS}$, and $V_{SS}$. P channel inverter circuit 80 also includes a P channel transistor 4, a resistor 5, and a capacitor 6.

A gate of P channel transistor 4 is connected to input terminal 51 through inverter circuit 31. The drain of P channel transistor 4 is connected to power source terminal 14 at a voltage level $V_{DD}$, and the source of P channel transistor 4 is connected, through resistor 5, to power source terminal 15. P channel transistor 4 is rendered conductive when its gate receives a LO signal (for example, $V_{SS}$). It becomes non-conductive when its gate receives a HI signal.

The source of P channel transistor 4 is connected to one terminal of capacitor 6, the other terminal of which is connected to power source terminal 16. The time constant RC' of capacitor 6 and resistor 5 is set longer than one cycle of the pulse basic clock signal. For example, it may be set two times or three times as long as one cycle of the basic clock signal.

In order to activate a downstream inverter stage when P channel transistor 4 transitions to the off state, the output voltage of P channel transistor 4 must be less than the threshold voltage of the downstream inverter, whose logical threshold voltage is approximately one half of $V_{DD}$. Therefore, an output signal from P channel transistor 4 requires a finite period to fall from HI to LO. The time period is longer than one pulse of pulse basic clock signal $\phi$. The output signal of P channel inverter circuit 80 is supplied through inverters 9 and 10 to a second detection signal output terminal, designated as node e in FIG. 3. The HI and LO logic states of the output signal at node e respectively constitute the third and fourth detection signals.

The invention includes shift register means connected to the clock signal generator means for receiving an input data signal, for assuming a shift register mode to produce an output data signal comprising a delayed input data signal in response to the first and second output clock signals, and for assuming a low-current mode in response to the first control signal. As embodied herein, the shift register means comprises a shift register unit 50 and an inverter 53, which forms an output driver circuit. Shift register unit 50 includes four shift register circuits 40, each of which includes first and second clock terminals $C_1$ and $C_2$, respectively. Shift register unit 50 further includes a data input terminal and a data output terminal $SO_2$, forming a junction with inverter 53.

Preferably, the clock signal generator means further comprises internal clock generating means, connected to the input terminal, to the first detection signal output terminal, and to the second detection signal output terminal, for outputting the first clock output signal at the first clock output terminal in response to the third detection signal, for outputting the second clock output signal at the second clock output terminal in response to the first detection signal, and for providing the first control signal to the first and second clock output terminals when the pulse basic clock signal is not provided to the input terminal. As embodied herein, the internal clock signal generating means comprises an internal clock generating circuit 90. Circuit 90 is comprised of a NOR gate 32, a NAND gate 34, and inverters 33, 35, and 36.

Input terminal 51 is connected, through inverter circuit 31, to one input of NAND gate 34. The other input of NAND gate 34 is connected to second detection signal output terminal e of P channel inverter circuit 80. The output signal of NAND gate 34 is supplied to a first system clock output terminal B through inverters 35 and 36 to provide a first clock output signal $\phi$.

First detection signal output terminal c of N channel inverter 70 is connected to one input of NOR gate 32, the other input of which is connected to the output of inverter 31. An output signal of NOR gate 32 is supplied to a second system clock output terminal A through inverter 33 to form a second clock output signal $\bar{\phi}$. The internal clock generating circuit supplies output signals to first and second system clock output terminals B and A in response to detection signals supplied at c and d by N and P channel inverter circuits 70 and 80.

First and second system clock output terminals B and A are connected to clock terminals in shift register circuits 40 of shift register unit 50. Circuits 40 and 50 are the same as circuits with corresponding reference characters shown in FIGS. 1 and 2.

Preferably, the invention includes means connected to the clock signal generator means for generating a second control signal when the constant level basic clock signal is received at the first logic level and when the constant level basic clock signal is received at the second logic level. As embodied herein, the second control signal generating means comprises an Exclusive NOR (XNOR) gate 54.

First and second detection signal output terminals c and e are connected to respective inputs of XNOR gate 54. The output terminal, node f, of XNOR gate 54 constitutes a second control signal output. In response to detection output signals generated by N and P channel inverter circuits 70 and 80, XNOR gate 54 generates a second control signal, consisting of a HI signal, when a constant level basic clock signal is supplied to input terminal 51.

Preferably, the invention includes control circuit means, connected to the means for generating a second control signal and connected to the junction of the shift register circuit and the output driver circuit, for providing a fixed voltage to the junction in response to the second control signal. As embodied herein, the control circuit means comprises an N channel MOS transistor 55 and power source terminal 17 at $V_{SS}$. Transistor 55 is connected between terminal 17 and data output terminal $SO_2$ of shift register unit 50. The gate of transistor 55 is connected to node f. Transistor 55 provides fixed LO voltage at data output terminal $SO_2$ in response to the second control signal supplied by XNOR gate 55.

Figure 4:
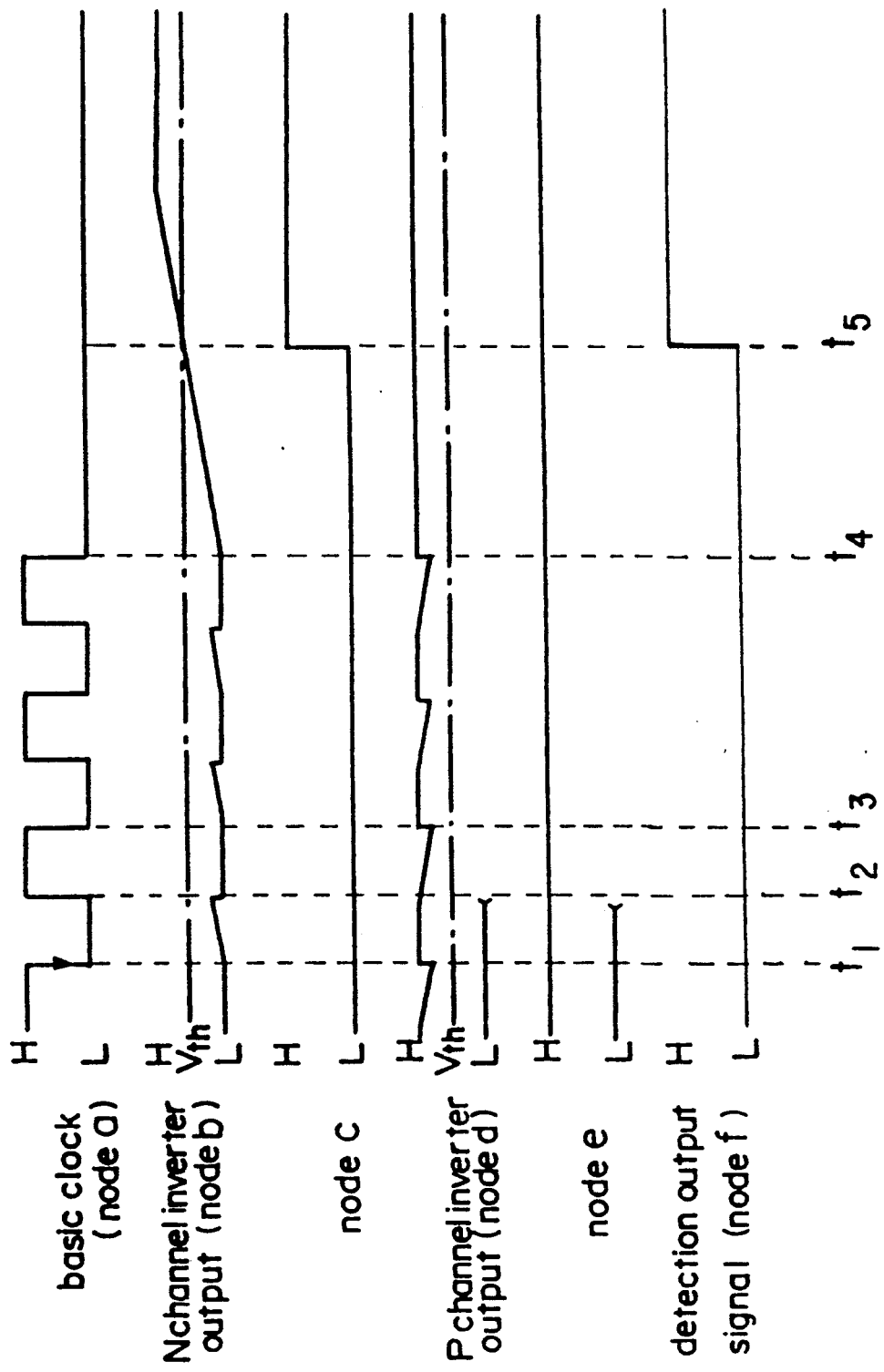
FIGS. 4 and 5 are signal waveform diagrams showing the operation of the clock generator shown in FIG. 3.

Operation of the embodiment of FIG. 3 will now be described, by reference to FIGS. 4 and 5. Referring to the signal waveform diagram of FIG. 4, when a pulse basic clock signal $\phi$ is supplied to input terminal 51 and inverted at node a, the associated intergrated circuit is in a normal operation mode. Between the time t1 and t4, the inverted pulse basic clock signal $\phi$ is supplied to the gate of N channel transistor 1 and the gate of P channel transistor 4. When the signal at node a is HI, the N channel transistor 1 is made conductive. Then, the signal at node b of N channel inverter circuit 70 is LO. When the signal at node a transitions from HI to LO, N channel transistor 1 becomes non-conductive. At this time, capacitor 3 is charged toward $V_{DD}$ through resistor 2, and the signal at node b gradually becomes HI. However, a finite period is required for the voltage level at node b to transistion from LO to HI. The time is sufficiently longer than the time period of one pulse of pulse basic clock signal $\phi$ so that the voltage at node b does not become HI between t1 and t2. The reason for this is that the time constant RC of capacitor 3 and resistor 2 is set longer than one cycle of pulse basic clock signal $\phi$, and inverter circuit 7 has a higher threshold voltage than the voltage level at node b during the time when pulse basic clock signal $\phi$ is LO (between t1 and t2). Accordingly, the voltage level of node c is always LO when pulse basic clock signal $\phi$ is supplied to the input terminal 51.

On the other hand, in P channel inverter circuit 80, P channel transistor 4 is made conductive when the pulse signal at node a is LO. During this period, node d in P channel inverter circuit 80 remains HI.

During the time when the pulse signal at node a is HI, between t2 and t3, P channel transistor 4 becomes non-conductive. At this time, capacitor 6 discharges, and the voltage level of node d gradually falls. However, it takes a finite period of time for the voltage level of node d to fall from HI to LO. This period of time is sufficiently longer than the time period of one pulse of pulse basic clock signal φ that the voltage of the node d never becomes LO. The reason for this is that the time constant R'C' of capacitor 6 and resistor 5 is set longer than one cycle of pulse basic clock signal φ, and inverter 9 has a lower threshold voltage than the lowest voltage level to which node d falls during the time when the pulse signal at node a is HI. Accordingly, voltage at node e remains at HI when pulse basic clock signal $\bar{\phi}$ is supplied to input terminal 51. Thus, when pulse basic clock signal φ is supplied to input terminal 51, N channel inverter circuit 70 always provides a LO output signal to internal clock generating circuit 90 and P channel inverter circuit 80 always provides a HI output signal to internal clock generating circuit 90. Internal clock generating circuit 90 outputs first system clock signal φ and second system clock signal φ, which is an inverted signal of first clock signal φ, in response to the three input signals supplied to internal clock generating circuit 90, namely, pulse basic clock signal φ, the signal from node c, and the signal from node e.

The first system clock signal φ at node B is supplied to the gates of transistors Q1 and Q8 of each shift register 40, and the second system clock signal $\bar{\phi}$ from node A is supplied to the gates of transistors Q4 and Q5 of each shift register 40. Shift register unit 50, in normal operation, assumes a shift register mode in which it shifts an input data signal D supplied by an internal integrated circuit. During a period between time t1 and time t4, a LO signal generated at node c by N channel inverter circuit 70 and a HI signal generated at node e by P channel inverter circuit 80 are supplied to the inputs of XNOR circuit 54. XNOR circuit 54 outputs a LO signal, which is supplied to the gate of N channel MOS transistor 55, rendering N channel MOS transistor 55 non-conductive. Accordingly, data signal D shifted by the shift register unit 50 is permitted to pass to the next integrated circuit through inverter circuit 53.

When the basic clock signal which is supplied to input terminal 51 changes from a pulse signal to a constant level signal, this indicates that the internal integrated circuit has entered a non-operational mode. For example, at time t4, the basic clock signal changes from a pulse signal to a constant HI. A constant LO signal is thus supplied by inverter 31 to node a, and the output signal of N channel transistor 1 (at node b) gradually rises from LO to HI within a time period determined by time constant RC. At time t5, the voltage level at node b reaches the threshold level of inverter circuit 7. The voltage level at node c then transitions from LO to HI. This HI is supplied from node c to one input of NOR gate 32 and to XNOR gate 54. At this time, the other input of NOR gate 32 is supplied with the LO signal at node a. As a result, NOR gate 32 and inverter 33 supply a HI signal to node A.

At time t4, the LO constant level signal supplied to node a causes P channel transistor 4 to be constantly conductive, thus maintaining the voltage level of node e at HI. This HI signal is supplied to one input of NAND gate 34 and to XNOR gate 54. At this time, the LO signal provided at node a also is supplied to the other input of NAND gate 34. As a result, NAND gate 34 and inverters 35 and 36 supply a HI to node B. Accordingly, when a constant level HI signal is supplied to input terminal 51 (resulting in a constant level LO signal at node a), the constant HI signals generated at both nodes A and B by internal clock generating circuit 90, which constitute a first control signal, are supplied to each shift register 40 of shift register unit 50. A HI signal generated by the XNOR gate 54, which constitutes a second control signal, is supplied to the gate of N channel MOS transistor 55.

Figure 5:
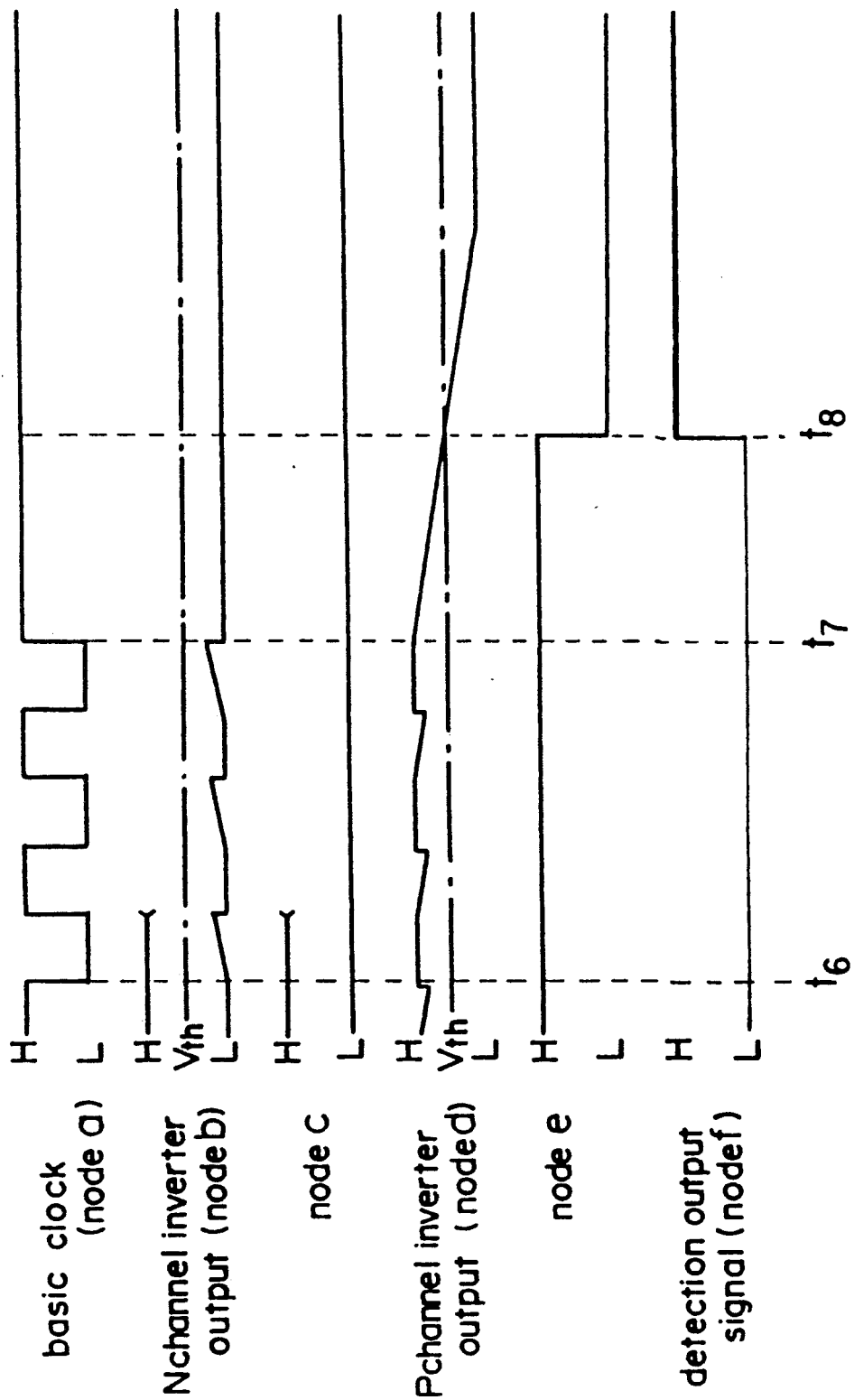

FIG. 5 illustrates operation of the embodiment of the invention when basic clock signal φ changes from a pulse signal to a constant LO signal at time T7. A constant HI is thus supplied to node a by inverter 31. The output signal of P channel transistor 4 (node d) gradually falls from HI toward LO. At time t8, the voltage level at node d reaches the threshold level of inverter circuit 9. The voltage level at node e then transistions from HI to LO. The signal at node e is supplied to respective inputs of NAND gate 34 and XNOR 54 gate. Also at this time, a HI signal outputted by inverter circuit 31 is supplied to the other input of NAND gate 34. As a result, a HI signal is supplied to node B.

On the other hand, the N channel transistor 1 is conductive at time t7, due to the constant level HI signal at the node a. The signal at nodes b and c is thus a constant LO. This LO signal is supplied to one input of NOR gate 32 and XNOR gate 54. Also at this time, the HI signal at node a is supplied to the other input of NOR gate 32. As a result, gate 32 and inverter 33 supply a constant HI signal to node A. Accordingly, the constant HI signal generated by internal clock generating circuit 90 is supplied to each shift register 40 of shift register unit 50, and a constant HI signal generated by XNOR gate 54 is supplied to N channel MOS transistor 55.

According to the circuit operation described above, when pulse basic clock signal is not supplied to input terminal 51, that is, when either a constant HI or a constant LO signal is supplied to input terminal 51, a HI signal is always supplied from nodes A and B to both system clock input terminals of each inverter circuit 40 and, consequently, to the gates of transistors Q1 and Q5. Thus, transistors Q1 and Q5 (FIG. 2) in each shift register 40 are rendered non-conductive. As a result, shift register unit 50 assumes a low-current mode in which current flow between $V_{DD}$ and $V_{SS}$ in shift registers 40 is prevented.

Furthermore, MOS transistor 55 is conductive, due to the HI signal supplied to its gate. The signal at the data output terminal of the shift register unit 50 is therefore driven LO. Accordingly, the voltage level of the data output terminal does not become an intermediate voltage between $V_{DD}$ and $V_{SS}$. As a result, current does not flow between $V_{DD}$ and $V_{SS}$ in the inverter circuit 53.

Figure 6:
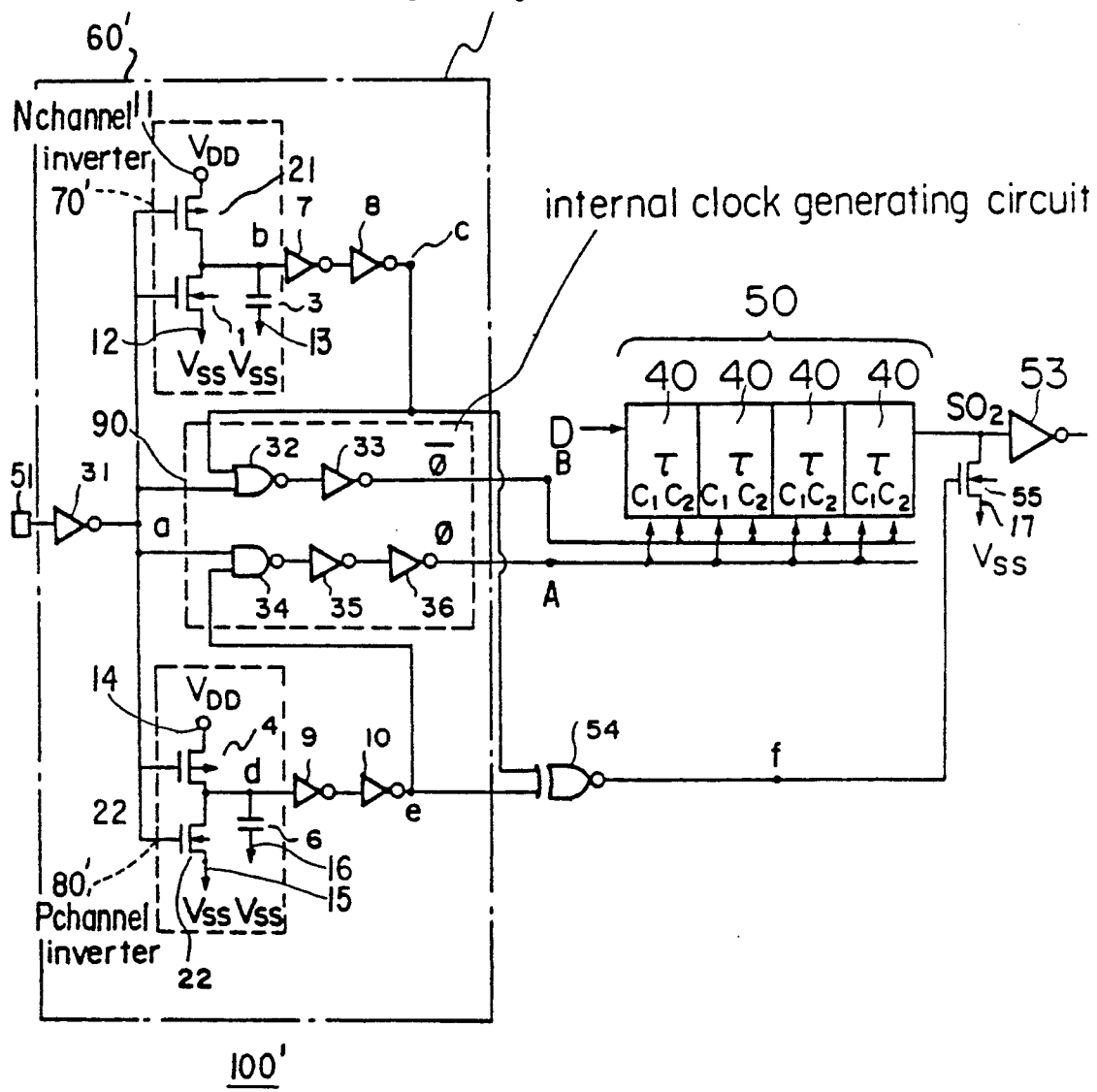
FIG. 6 shows a digital data circuit according to another embodiment of this invention.

FIG. 6 shows a digital data circuit 100', which is a modification of digital data circuit 100 shown in FIG. 3 and which constitutes an alternative embodiment of the invention. In FIG. 6, the same reference numerals are assigned to the parts or elements corresponding to those shown in FIG. 3, and further explanation of such corresponding parts and elements is omitted for the sake of brevity.

Digital data circuit 100' includes a clock signal generator circuit 60' having N channel and P channel inverter circuits 70' and 80', respectively. In N channel and P channel inverter circuits 70' and 80', a P channel MOS transistor 21 and an N channel MOS transistor 22 are used in place of the resistors 2 and 5, respectively. Circuits 70' and 80' operate in the same fashion as circuits 70 and 80 of FIG. 3 and produce the same effect.

It can be seen from the described embodiments of this invention, that the invention prevents undesired excessive current flow in the dynamic circuit when the basic clock signal is not supplied to the input terminal.

It will be apparent to those skilled in the art that various modifications and variations can be made in the methods and apparatus of the present invention without departing from the spirit or scope of the invention. For example, in the described embodiments of this invention, basic clock signal φ is supplied to input terminal 51 by an external integrated circuit. However, a clock oscillator for generating basic clock signal φ may be provided on the same chip as the clock generator. The present invention covers such modifications and variations which are within the scope of the appended claims and their equivalents.

What is claimed is:

1. A digital data circuit for use with a clock oscillator having an operational mode and a non-operational mode, the clock oscillator producing a basic clock signal consisting of a pulse basic clock signal operating between first and second logic levels during the operational mode and a constant level basic clock signal during the non-operational mode, the digital data circuit comprising:

clock signal generator means, having an input terminal for receiving the basic clock signal, for outputting first and second output clock signals when the pulse basic clock signal is received, and for outputting a first control signal fixed at the first logic level both when the constant level basic clock signal at the first logic level is received and when the constant level basic clock signal at the second logic level is received; and shift register means, coupled to the clock signal generator means to receive the first and second output clock signals and the first control signal, for receiving an input data signal, for assuming a shift register mode to produce an output data signal comprising a delayed input data signal in response to the first and second output clock signals, and for assuming, in response to the first control signal, a low-current mode in which the output data signal is not produced.

2. A digital data circuit as recited in claim 1 wherein the shift register means comprises:

a first clocked complementary MOS inverter circuit (first $C^2MOS$) and a second clocked complementary MOS inverter circuit (second $C^2MOS$) each including first and second power source terminals, the second $C^2MOS$ being coupled to the first $C^2MOS$;

a data input terminal coupled to the first $C^2MOS$ for receiving the data input signal;

first and second clock input terminals respectively coupled to the first and second $C^2MOS$ for receiving the first and second clock output signals; and a data output terminal coupled to the second $C^2MOS$ for providing the output data signal consisting of the input data signal shifted by the first and second $C^2MOS$ in accordance with the first and second clock output signals.

3. A digital data circuit as recited in claim 2, wherein each of the first $C^2MOS$ and the second $C^2MOS$ comprises first and second P channel MOS transistors each having a gate and being connected in series between the first power source terminal and the data output terminal, each of the first and second $C^2MOS$ also comprising first and second N channel MOS transistors each having a gate and being connected in series between the second power source terminal and the data output terminal, a gate of the first P channel MOS and a gate of the first N channel MOS being connected to the data input terminal, and a gate of the second P channel MOS being connected to the first clock output terminal and a gate of the second N channel MOS is connected to the second clock output terminal, and the data output terminal of the first $C^2MOS$ being connected to the input terminal of the second $C^2MOS$.

4. A digital data circuit as recited in claim 1:

wherein the shift register means comprises a shift register circuit and an output driver circuit, the shift register circuit and the output driver circuit being connected together at a junction;

wherein the digital data circuit comprises means connected to the input terminal of the clock signal generator means for generating a second control signal when the constant level and when the constant level basic clock signal is received at the second logic level; and wherein the digital data circuit comprises control circuit means, connected to the means for generating a second control signal and connected to the junction of the shift register circuit and the output driver circuit, for providing a fixed voltage to the junction in response to the second control signal.

5. A digital data circuit as recited in claim 1 wherein the clock signal generator means comprises:

first detection circuit means, connected to the input terminal and having a first detection signal output terminal, for outputting a first detection signal when the pulse basic clock signal is provided to the input terminal and for outputting a second detection signal when the constant level basic clock signal is provided to the input terminal; and second detection circuit means, connected to the input terminal and having a second detection signal output terminal, for outputting a third detection signal when the pulse basic clock signal is provided to the input terminal and for outputting a fourth detection signal when the constant level basic clock signal is provided to the input terminal; and internal clock generating means, connected to the input terminal, to the first detection signal output terminal, and to the second detection signal output terminal, for outputting the first clock output signal at a first clock output terminal in response to the first detection signal, for outputting the second clock output signal at a second clock output terminal in response to the third detection signal, and for providing the first control signal to the first and second clock output terminals when the constant level basic clock signal is provided to the input terminal.

6. A clock generator circuit for use with a clock oscillator having an operational mode and a non-operational mode, the clock oscillator producing a basic clock signal consisting of a pulse basic clock signal operating between first and second logic levels during the operational mode and a constant level basic clock signal during the non-operational mode, the clock generator circuit comprising:

an input terminal for receiving the basic clock signal;
   first and second clock output terminals;
   first detection circuit means, connected to the input terminal and having a first detection signal output terminal for outputting a first detection signal when the pulse basic clock signal is provided to the input terminal and for outputting a second detection signal when the constant level basic clock signal is provided at the input terminal;

second detection circuit means, connected to the input terminal and having a second detection signal output terminal, for outputting a third detection signal when the pulse basic clock signal is provided to the input terminal and for outputting a fourth detection signal when the constant level basic clock signal is provided at the input terminal; and internal clock generating means, connected to the input terminal, to the first detection signal output terminal, and to the second detection signal output terminal, for outputting the first clock output signal at the first clock output terminal in response to the third detection signal, for outputting the second clock output signal at the second clock output terminal in response to the first detection signal, and for providing a first control signal to the first and second clock output terminals when the constant level basic clock signal is provided at the input terminal.

7. A clock generator circuit as recited in claim 6 comprising:

means, connected to the first and second detection signal output terminals, for generating a second control signal when the second detection signal is outputted and when the fourth detection signal is outputted; and control circuit means, connected to the means for generating a second control signal, for providing a fixed voltage to an associated circuit in response to the second control signal.

8. A digital data circuit as recited in claim 7 wherein the means for generating the second control signal comprises a logic circuit connected to the first detection signal output terminal and the second detection signal output terminal, the logic circuit including a control signal output terminal for outputting the second control signal when one of the second and fourth detection signals are provided to the logic circuit by the first and second detection means.

* * * * *

UNITED STATES PATENT AND TRADEMARK OFFICE
CERTIFICATE OF CORRECTION

PATENT NO. : 5,12C,988
DATED : June 09, 1992
INVENTOR(S) : Koji MATSUKI

It is certified that error appears in the above-identified patent and that said Letters Patent is hereby corrected as shown below:

```
Claim 4, column 10, line 18, after "level" insert
to --basic clock signal is received at the first
logic level--.
```

Signed and Sealed this

Fifth Day of October, 1993

*Attest:*

BRUCE LEHMAN

*Attesting Officer*     Commissioner of Patents and Trademarks